(12) United States Patent
Wada et al.

(10) Patent No.: US 8,907,495 B2
(45) Date of Patent: Dec. 9, 2014

(54) SEMICONDUCTOR DEVICE AND MANUFACTURING METHOD THEREOF

(71) Applicant: Kabushiki Kaisha Toshiba, Tokyo (JP)

(72) Inventors: Makoto Wada, Yokohama (JP); Akihiro Kajita, Yokohama (JP); Atsunobu Isobayashi, Yokohama (JP); Tatsuro Saito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 4 days.

(21) Appl. No.: 13/846,513

(22) Filed: Mar. 18, 2013

(65) Prior Publication Data

US 2014/0070425 A1 Mar. 13, 2014

(30) Foreign Application Priority Data

Sep. 10, 2012 (JP) .................................. 2012-198266

(51) Int. Cl.
H01L 29/06 (2006.01)
H01L 21/768 (2006.01)
H01L 23/538 (2006.01)
B82Y 40/00 (2011.01)

(52) U.S. Cl.
CPC ...... *H01L 23/5384* (2013.01); *H01L 21/76877* (2013.01); *B82Y 40/00* (2013.01)
USPC ............... 257/774; 257/28; 257/29; 257/784; 257/750; 257/767

(58) Field of Classification Search
CPC ..................... H01L 23/5221–23/5228; H01L 29/1602–29/1608
USPC ........................ 257/774, 28, 29, 784, 750, 767
See application file for complete search history.

(56) References Cited

U.S. PATENT DOCUMENTS

| | | | | |
|---|---|---|---|---|
| 8,169,085 B2* | 5/2012 | Akimoto et al. | ............... | 257/784 |
| 8,378,335 B2* | 2/2013 | Yamazaki et al. | ............... | 257/29 |
| 2011/0006425 A1 | 1/2011 | Wada et al. | | |
| 2011/0101528 A1 | 5/2011 | Akimoto et al. | | |
| 2012/0068160 A1 | 3/2012 | Yamazaki et al. | | |

FOREIGN PATENT DOCUMENTS

| | | | |
|---|---|---|---|
| JP | 2007-088373 A | | 4/2007 |
| JP | 2009-070911 A | | 4/2009 |
| JP | 2012-054303 A | | 3/2012 |

* cited by examiner

*Primary Examiner* — Telly Green
*Assistant Examiner* — Damian A Hillman
(74) *Attorney, Agent, or Firm* — Holtz, Holtz, Goodman & Chick PC

(57) ABSTRACT

According to one embodiment, a semiconductor device includes a semiconductor substrate including semiconductor elements formed thereon, a graphene wiring structure stuck on the substrate with a connection insulating film disposed therebetween and including graphene wires, and through vias each formed through the graphene wiring structure and connection insulating film to connect part of the semiconductor elements to the graphene wires.

7 Claims, 7 Drawing Sheets

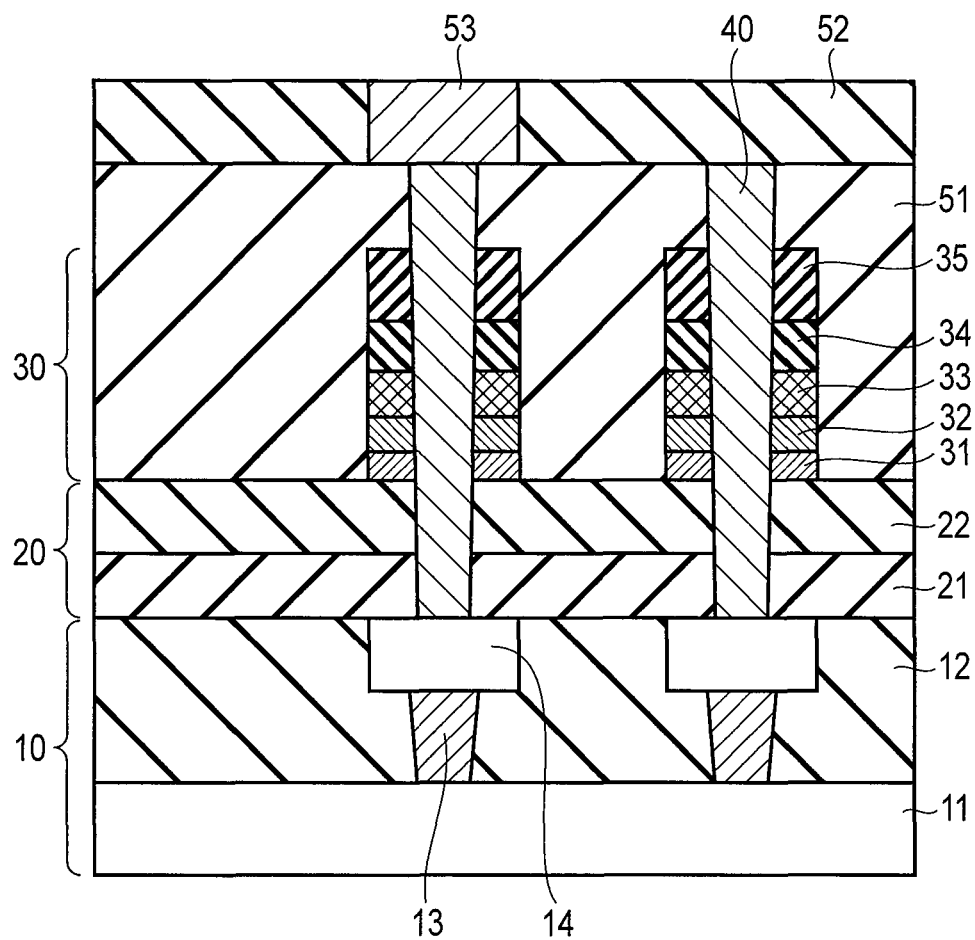
F I G. 1

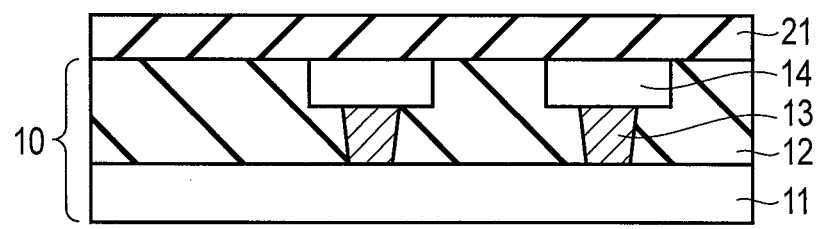
F I G. 2A
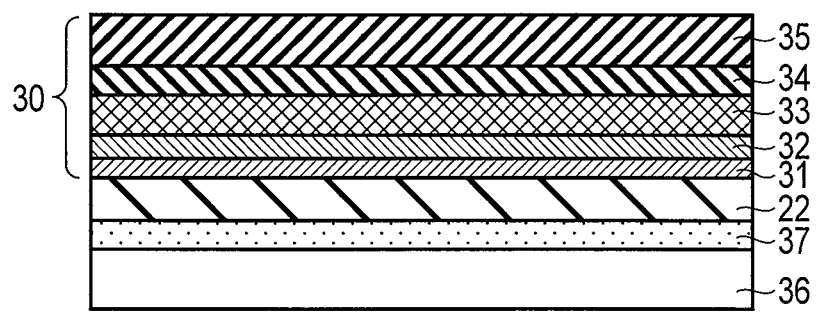
F I G. 2B
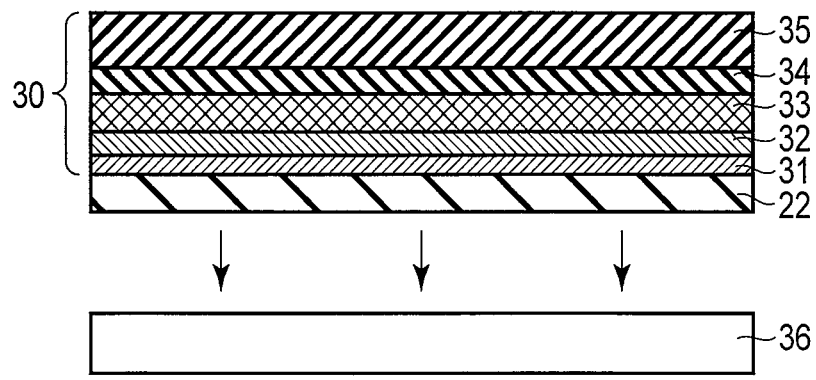
F I G. 2C

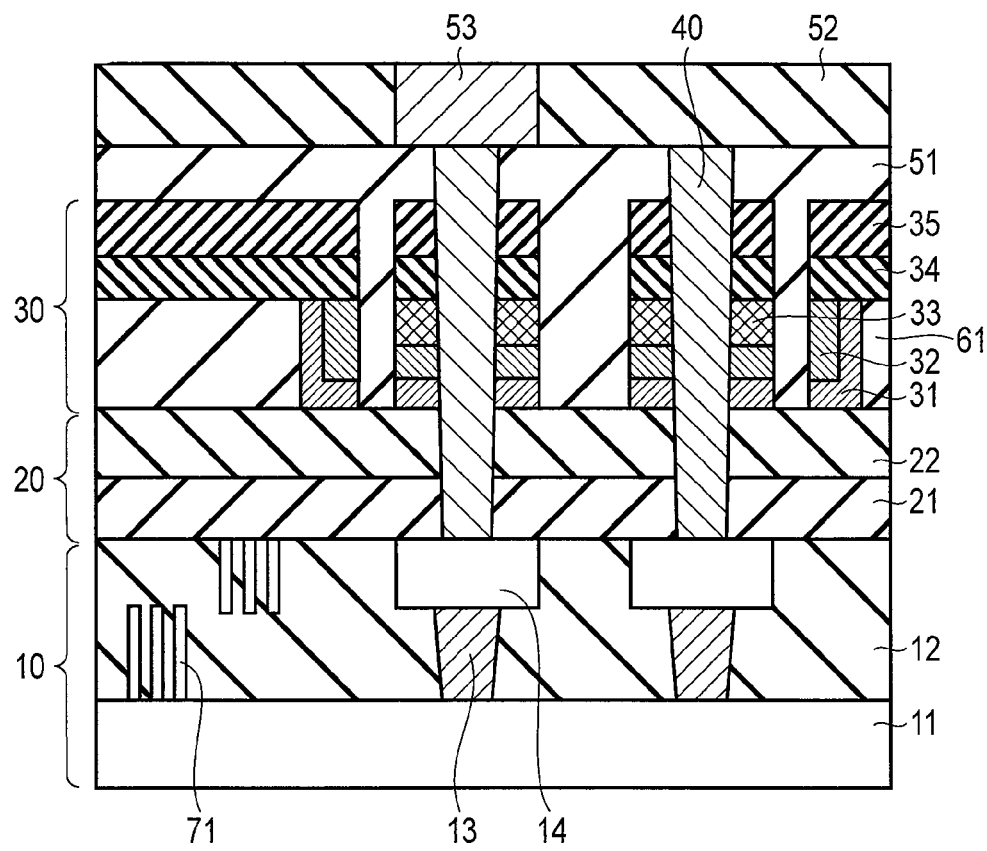
F I G. 3

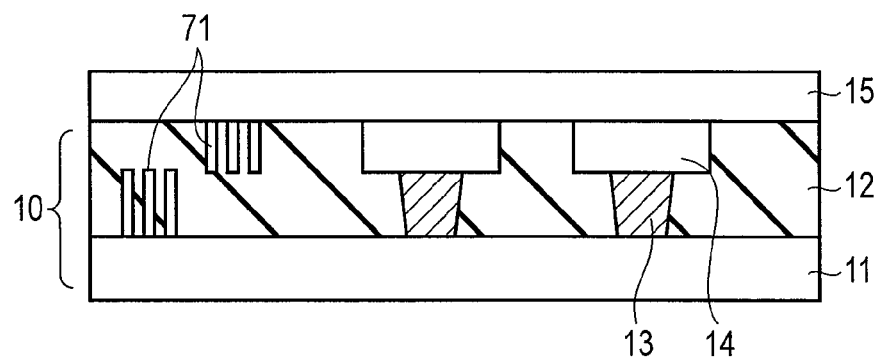
F I G. 4A
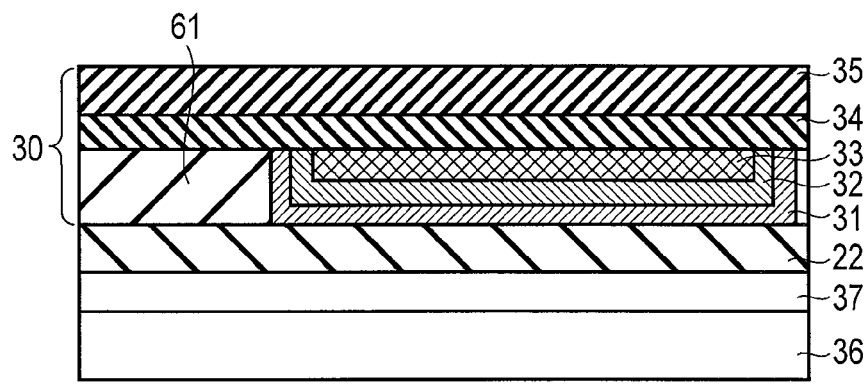
F I G. 4B
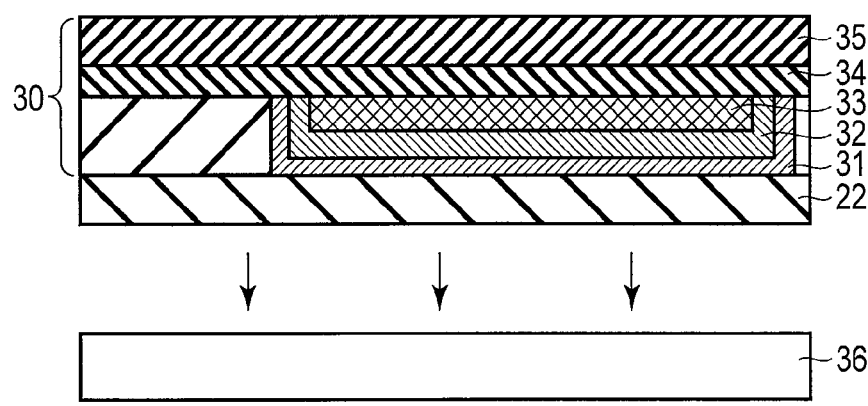
F I G. 4C

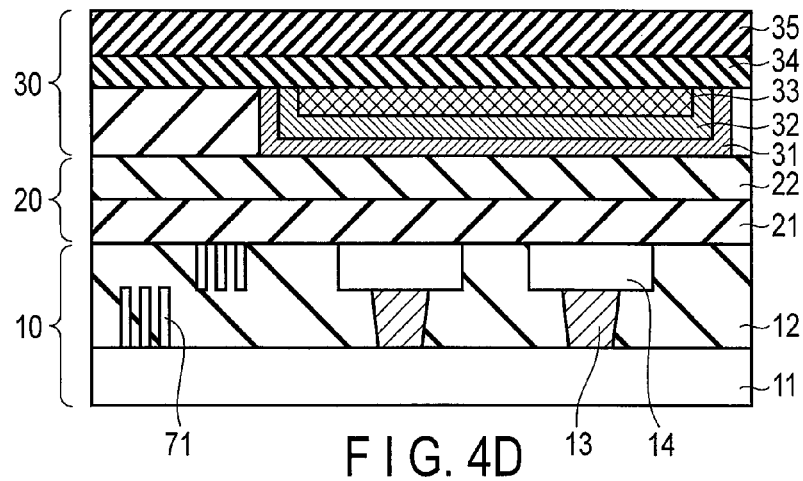
F I G. 4D
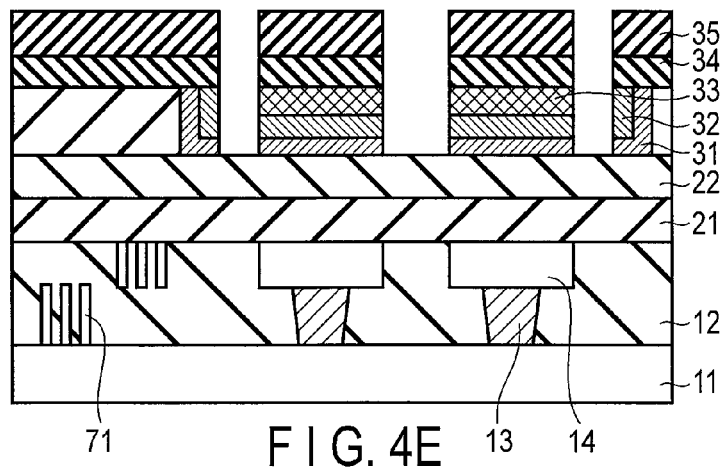
F I G. 4E
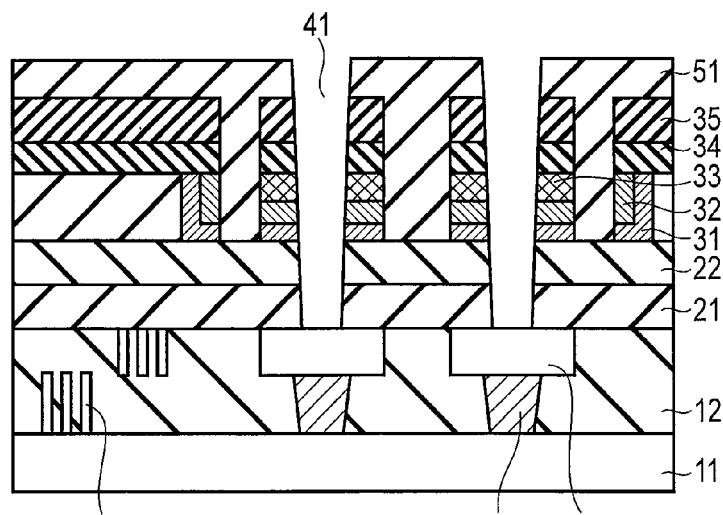
F I G. 4F

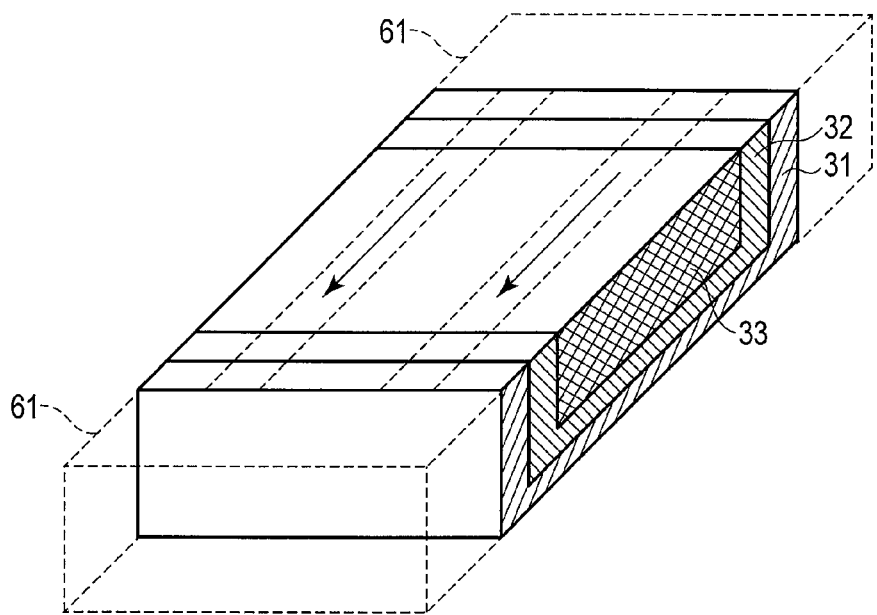
F I G. 5
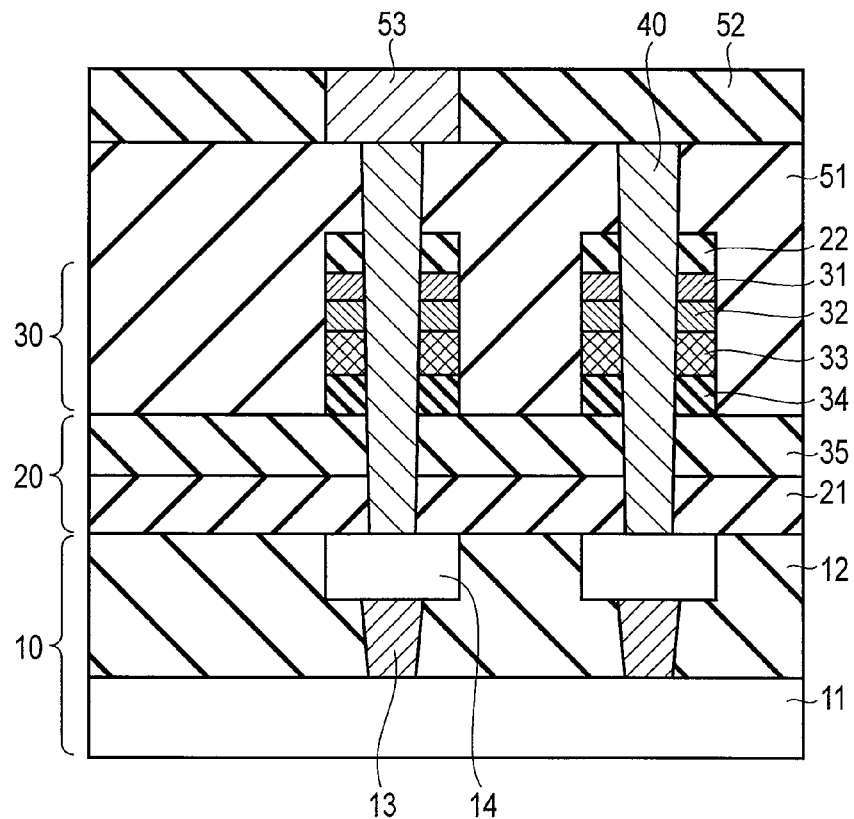
F I G. 6

US 8,907,495 B2

SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2012-198266, filed Sep. 10, 2012, the entire contents of which are incorporated herein by reference.

FIELD

Embodiments described herein relate generally to a semiconductor device using graphene wires and a manufacturing method thereof.

BACKGROUND

Recently, a graphene wiring structure using graphene wires instead of metal wires has received much attention. Since graphene has a quantization-conduction characteristic (ballistic conduction characteristic) like a carbon nano-tube and conducts electricity by quantization, it is advantageous in comparison with electrical conduction of a long-distance wire. Further, the graphene structure itself is an extremely thin film and can be formed by use of a CVD method. Therefore, a graphene wire has a high degree of matching with respect to a device wire formation process.

BRIEF DESCRIPTION OF THE DRAWINGS

FIG. 1 is a cross-sectional view showing the schematic structure of a semiconductor device according to a first embodiment.

FIGS. 2A to 2F are cross-sectional views showing manufacturing steps of the semiconductor device of FIG. 1.

FIG. 3 is a cross-sectional view showing the schematic structure of a semiconductor device according to a second embodiment.

FIGS. 4A to 4F are cross-sectional views showing manufacturing steps of the semiconductor device of FIG. 3.

FIG. 5 is a perspective view showing an extracted graphene wire portion of the semiconductor device of FIG. 3.

FIG. 6 is a cross-sectional view showing the schematic structure of a semiconductor device according to a third embodiment.

DETAILED DESCRIPTION

Figure 2D:
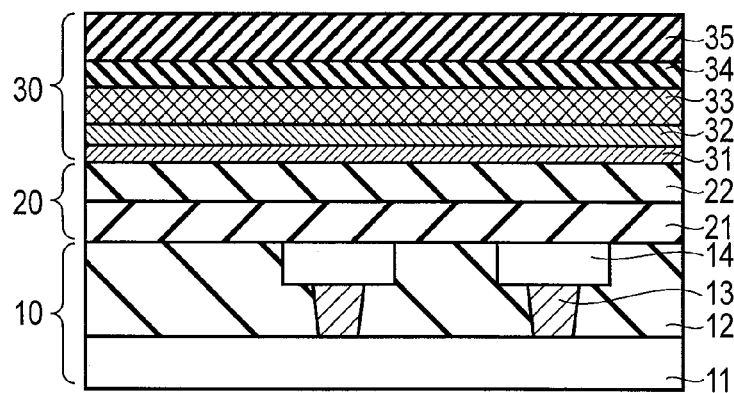

In general, according to one embodiment, a semiconductor device comprises a semiconductor substrate including semiconductor elements formed thereon, a graphene wiring structure stuck on the substrate with a connection insulating film disposed therebetween and including graphene wires, and through vias each formed through the graphene wiring structure and connection insulating film to connect part of the semiconductor elements to the graphene wires.

In the semiconductor device using the graphene wires, the following problem occurs. That is, when a graphene film is formed by use of a CVD method, for example, ethanol or acetylene is used as a source gas of CVD film formation. A film formation temperature of at least 450° C. or more is normally required in the plasma CVD method in which low-temperature film formation can be achieved to decompose the source gas and form a graphene film on a catalyst metal layer. Further, when a magnetic transformation type memory element or ion variation type memory element structure is used as the device structure below the wiring layer, for example, the phase structure of the memory element is changed or collapsed at the graphene CVD film formation temperature of 450° C. or more described above. Therefore, the above temperature range cannot be utilized. When a thermal decomposition CVD method is used as the CVD method, higher temperatures (generally, 600° C. or more) are required. Further, when the CVD film formation temperature is lowered, the rate of the density of defects occurring in a graphene sheet increases thereby to cause scattering of electrons (carriers) and increase the wiring resistance.

Thus, since the temperature at which the graphene layer is formed is high, it is difficult to apply the graphene wiring structure to the device element structure that copes with the low temperature. The object of the present embodiment is to apply a graphene wiring structure of extremely low resistance to the low-temperature coping device element structure and enhance the element characteristic.

A semiconductor device of the embodiment is explained below with reference to the drawings.

First Embodiment

FIG. 1 is a cross-sectional view showing the schematic structure of a semiconductor device according to a first embodiment.

Semiconductor elements 14 formed of memory elements or the like are formed on an upper portion of an Si substrate (semiconductor substrate) 11 to form a first substrate 10. A graphene wiring structure (second substrate) 30 including graphene wires is stacked above the first substrate 10 with an insulating film 20 (21, 22) disposed therebetween. That is, the first substrate 10 and the second substrate 30 are stuck together and stacked with the insulating film 20 disposed therebetween.

The first substrate 10 is obtained by forming the semiconductor elements 14 such as magnetic transformation type memory elements or ion variation type memory elements on the Si substrate 11 and each semiconductor element 14 is connected to the Si substrate 11 via a lower-layer contact 13. In this case, the semiconductor element 14 is formed at a low-temperature process temperature of 400° C. or less.

The insulating film 20 is obtained by sticking and integrating a connection insulating film 21 on the first substrate 10 side with a connection insulating film 22 on the graphene wiring structure 30 side.

The graphene wiring structure 30 is formed by forming a wiring pattern having the stack structure of a catalyst underlying layer 31, catalyst layer 32, graphene layer 33, graphene protection layer 34 and upper-layer insulating film 35 on the insulating film 22. The upper surfaces of the wiring pattern of the graphene wiring structure 30 and the connection insulating film 22 are covered with an interlayer insulating film 51.

Through vias 40 are formed to penetrate the interlayer insulating film 51 and graphene wiring structure 30 and reach the first substrate 10. A protection insulating film 52 is formed on the interlayer insulating film 51 and through vias 40 and part of the protection insulating film 52 is removed to form an upper-layer wire 53.

As described above, in the present embodiment, the graphene wiring structure is formed by use of the substrate that is different from the substrate structure having the low-temperature coping semiconductor elements. Then, the substrates are stacked at the wafer level to realize a device structure in which the graphene wire of the extremely low resistance is applied to the low-temperature coping element.

Next, the manufacturing method of the semiconductor device of this embodiment is explained with reference to FIGS. 2A to 2F.

FIG. 2A shows the structure of the first substrate 10 including low-temperature coping semiconductor elements. The first substrate 10 is used as a base substrate to be stuck. Magnetic transformation type memory elements or ion variation type memory elements are formed as semiconductor elements 14 above an Si substrate 11 having semiconductor elements such as transistors and capacitors formed thereon. An interlayer insulating film 12 is formed between the Si substrate 11 and the semiconductor elements 14 and the semiconductor elements 14 are connected to the Si substrate 11 via lower-layer contacts 13. In this case, the respective portions including the semiconductor elements 14 are formed at a process temperature of normally 400° C. or less.

A connection insulating film 21 for connection of a graphene wiring layer formed on a different substrate is formed on the upper layer of the first substrate 10 having a device formed at a low temperature. The connection insulating film 21 is formed at a process temperature of normally 400° C. or less. The connection insulating film 21 is an $SiO_2$ film, for example. A case wherein the low-temperature coping semiconductor element structure is formed above the Si substrate 11 is shown in FIG. 2A, but the case is not limited to this and a structure in which the low-temperature coping semiconductor elements 14 are directly formed on the Si substrate 11 may be provided. In this case, the connection insulating film 21 is formed on the Si substrate 11 on which the semiconductor elements 14 are formed.

FIG. 2B shows the structure of a second substrate 30 on the sticking side (lead-out side). For example, an Si substrate is used as an underlying substrate 36. Since the underlying substrate 36 is separated later and removed from the semiconductor device, the substrate is not necessarily an Si substrate whose resistance is controlled with high precision and may be an Si substrate of a low standard. Further, the substrate may be a substrate that is recycled plural times. Further, the substrate is not limited to an Si substrate and may be a glass substrate or the like.

A separation layer 37 is formed on the underlying substrate 36. The separation layer 37 is a layer that is selectively melted by alkali treatment or the like and the underlying substrate 36 is separated by use of the separation layer 37 in the later step. A connection insulating film 22 for connection with the substrate 10 including the low-temperature coping semiconductor elements is formed on the separation layer 37. The connection insulating film 22 is an $SiO_2$ film, for example.

A second substrate 30 having a graphene layer is formed on the connection insulating film 22. Specifically, a catalyst underlying layer 31 for forming a graphene layer and a catalyst layer 32 are formed on the connection insulating film 22. The catalyst underlying layer 31 is a layer that accelerates the growth of a graphene layer and has a function of crystallinity control of the upper catalyst layer 32 and a function as a catalytic promoter for the growth of a graphene layer. As a typical catalyst underlying layer material, Ti, Ta, Ru, W and the nitride thereof are provided. Further, the oxide of the above metal may be used. Additionally, a stack film obtained by stacking the above films may be used. The catalyst layer 32 is a layer required for forming a graphene layer and is formed continuously to the sidewalls of the wiring structure. As a catalyst material, it is preferable to use a single metal of Co, Ni, Fe, Ru, Cu or the like, an alloy including at least one of them or a carbide of the above material. It is preferable that the catalyst layer 32 is formed of a continuous film and the catalyst layer is required to have a film thickness of at least 0.5 nm or more to form a continuous film.

Next, a graphene layer 33 is formed on the catalyst layer 32. The graphene layer 33 has an extremely thin film structure having one layer to approximately several ten layers of graphite films stacked. The graphene layer 33 is formed by use of a thermal CVD method or plasma CVD method at 450° C. or more and, for example, methanol, ethanol, acetylene or the like is used as a source gas for the CVD method.

Since the density of defects contained in the graphene sheet becomes lower as the graphene growth temperature is higher, it is preferable to form a film at a high temperature. However, when a film is formed at a high temperature of normally 700° C. or more, surface cohesion may occur in the thermal step for graphene film formation on a metal layer of, for example, Co or Ni that is the under-layer catalyst layer 32. If large surface cohesion occurs, the catalyst layer 32 becomes discontinuous and, at this time, the graphene layer 33 formed on the catalyst layer 32 may also become discontinuous in some cases. If graphene is grown at a high temperature of, for example, 800° C. or more to prevent the above problem, it is effective to use an alloy catalyst layer having a refractory metal such as W, Mo or Ir added in the catalyst layer 32. Further, a method for subjecting the catalyst layer 32 to a nitriding process and using the resultant layer as a metal compound is effective.

Next, a graphene protection layer 34 is formed on the graphene layer 33 to protect the graphene layer 33 or control the mobility of electrons in the graphene layer 33. For example, the protection layer 34 is an insulating film material such as $SiO_2$ or SiN or a metal layer of Ni, Co, Pt, Au, Cr or the like. An upper-layer insulating layer 35 is formed on the protection layer 34. The protection layer 34 is not necessarily provided and can be omitted.

Next, as shown in FIG. 2C, the separation layer 37 is melted by alkali treatment to separate the connection insulating film 22 and the second substrate 30 formed thereon from the underlying substrate 36. The second substrate 30 has the structure in which the graphene layer 33 is sandwiched between the insulating film structures lying on and under graphene, the catalyst underlying layer 31, catalyst layer 32, graphene protection film 34 and the like. Therefore, even if the second substrate 30 is separated from the underlying substrate 36, the substrate is not basically rolled or cracked.

If the film stress of the catalyst layer 32 or graphene layer 33 is high and the lead-out structure is rolled or cracked when the substrate is separated from the underlying substrate 36, a temporary connection layer and support substrate may be provided on the upper-layer insulating film 35 before separating the substrate from the underlying substrate 36. As the temporary connection layer, a film having a composition different from that of the separation layer 37 formed for separation from the lower-layer substrate 36 or a film whose film thickness is varied is used to prevent the temporary connection layer from being melted. As the support substrate, for example, an Si substrate, glass substrate or the like is used. Instead of using the separation layer 37 for separation from the underlying substrate 36, a method such as CMP or sand blast method for cutting off and removing the underlying substrate 36 may be used.

Next, as shown in FIG. 2D, a second substrate 30 having the graphene layer 33 is stuck on the first substrate 10 having the low-temperature coping semiconductor elements 14. The sticking process is performed by use of the connection insulating films 21, 22 to stack the structure having the graphene layer 33 on the upper portion of the first substrate 10 having the low-temperature coping semiconductor elements 14. The sticking process is performed at a wafer level.

The connection insulating films 21, 22 used as sticking portions are stuck to each other by forming a —OH radical or —H radical on the insulating film surface by subjecting the surface to a plasma process, mechanically contacting the insulating films to each other and performing a thermal process. The wafer sticking process may be performed in a vacuum atmosphere or air atmosphere. The wafer sticking temperature can be set lower by performing the wafer sticking process in a vacuum atmosphere. The plasma process may be performed for one of the connection insulating film 21 on the first substrate 10 side and the connection insulating film 22 on the second substrate 30 side or for both of the films. When the temporary sticking layer and support substrate are formed on the upper portion of the second substrate 30, the temporary sticking layer is removed and separated from the support substrate by alkali treatment or the like after sticking the films.

Figure 2E:
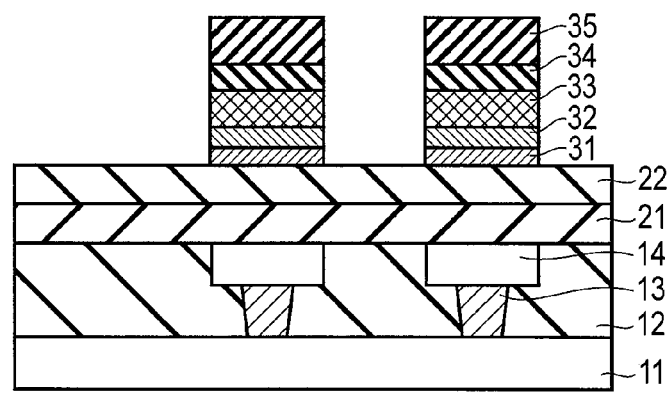

Next, as shown in FIG. 2E, a lithography step and RIE processing step for forming the graphene layer 33 and the peripheral layer structure (31, 32, 34, 35) thereof into a wiring form are performed to form graphene wires. For the purpose of easily performing the RIE process, a hard mask used for processing may be formed. The processing hard mask is an insulating film such as an $SiO_2$ film or SiN film or a metal compound film of TiN or the like.

Figure 2F:
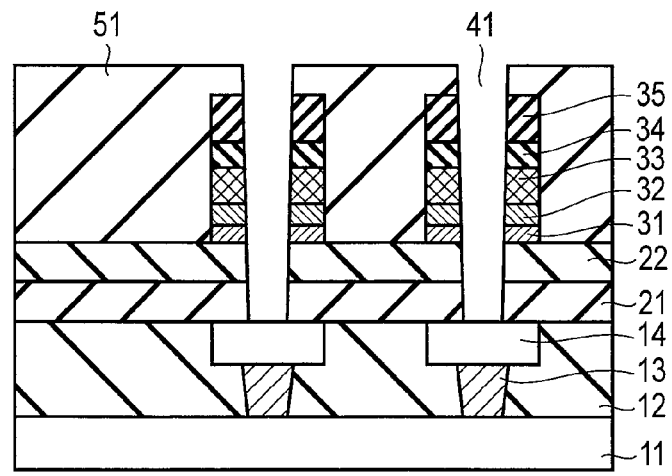

Next, as shown in FIG. 2F, after an interlayer insulating film 51 is formed on the connection insulating film 22 to cover the graphene wires, contact holes 41 for connecting the graphene wires to the lower-layer semiconductor elements 14 are formed. The contact holes 41 are formed to penetrate the graphene wires including the graphene layers 33 and reach respective portions of the lower-layer semiconductor elements 14. Then, for example, W used as a conductive material is filled in the contact holes 41 to form through vias 40. As a result, the graphene layers 33 and semiconductor elements 14 are electrically connected.

For the purpose of reducing the contact resistance between the through vias 40 and graphene layers 33, a metal such as Ti, TiN, Ni, Co or the like may be formed on the inner wall surface of the contact hole 41. Further, when the circuit structure is formed to contact the through via 40 only with the graphene wire, it is not always necessary to form a semiconductor element on the lower layer. Alternatively, a structure in which a dummy element region that does not actually function as an element is provided and a through via 40 is formed therein may be provided. Further, when the circuit structure is formed to directly connect a through via to the semiconductor element 14 without making contact with the graphene layer 33, a structure in which only the through via is directly formed on the semiconductor element without forming a graphene wiring structure in this region may be provided.

After this, the structure shown in FIG. 1 is realized by forming a protection insulating film 52 on the upper-layer side and upper-layer wires 53. As the circuit structure, the upper-layer wire 53 may be formed on the through via 40 when the graphene wire is connected to the upper-layer wire 53. If it is unnecessary to connect the graphene wire to the upper-layer wire 53, a structure in which the protection insulating film 52 is formed to cover the upper portion of the through via 40 without providing the wire 53 on the upper portion of the through via 40 may be used.

Thus, according to the present embodiment, the first substrate 10 having the low-temperature coping semiconductor elements 14 is formed by a low-temperature process of 400° C. or less and the second substrate 30 having the graphene wires is formed separately from the first substrate 10 by a high-temperature process of 450° C. or more. Then, the graphene wires can be realized on the first substrate 10 by sticking the substrates together. In this case, the sticking process is performed at temperatures of 400° C. or less and does not give thermal influence to the first substrate 10. Therefore, the graphene wiring structure of the extremely low resistance can be applied to the low-temperature coping device element structure, and as a result, the element characteristic can be enhanced.

Further, the first and second substrates 10, 30 can be respectively formed at adequate temperatures and the element characteristic can also be enhanced. Additionally, since the side surfaces of the through vias 40 are connected to the graphene wires, the connection area becomes large and an advantage that the contact resistance is obtained can be obtained.

Second Embodiment

FIG. 3 is a cross-sectional view showing the schematic structure of a semiconductor device according to a second embodiment. The same symbols are attached to the same portions as those of FIG. 1 and the detailed explanation thereof is omitted.

The present embodiment is different from the first embodiment explained before in that the structure in which graphene is provided only in a region corresponding to a wire formation region of an underlying substrate is used as the graphene wiring structure. That is, grooves are formed in alignment with the wire formation region of the underlying substrate in an insulating film 61 formed on a connection insulating film 22 and a catalyst underlying layer 31, catalyst layer 32 and graphene layer 33 are formed in the grooves in a second substrate 30. Then, a graphene wire portion formed in the grooves is processed in a wiring pattern. Further, an alignment mark 71 is formed on the first substrate 10 side.

Next, a manufacturing method of the semiconductor device of the present embodiment is explained with reference to FIGS. 4A to 4F.

FIG. 4A shows the substrate structure having low-temperature coping semiconductor elements formed thereon and the basic configuration thereof is the same as that of FIG. 2A. Additionally, the mark 71 used for attaining rough alignment at a wafer level is formed in the first substrate 10. It is sufficient if the mark 71 can be recognized from above and the mark can be simultaneously formed in the interlayer insulating film 12 at the time of formation of lower-layer contacts 13 and semiconductor elements 14. For example, the mark may be obtained by filling a contact material in a line & space pattern in the interlayer insulating film 12.

FIG. 4B shows the structure on the to-be-stuck side (lead-out side) and the basic configuration thereof is the same as that of FIG. 2B. However, the graphene wire portion is not simply stacked but is formed in a partial region corresponding to a region in which wires are to be formed. That is, a pattern used for graphene formation is formed to easily form graphene layers 33 in the substrate 30 on the graphene formation side. The pattern formation process is performed at a level at which the alignment precision with respect to the semiconductor element used as a connection destination in the sticking process at a wafer level can be made sufficiently high. For example, a pattern used for graphene formation with large size attained by adding the alignment precision distance at the wafer level is formed to make it possible to sufficiently cover the semiconductor element region of the connection destination.

The pattern used for easy graphene formation has a damascene groove structure as shown in FIG. 5 that utilizes the growth from the sidewalls of graphene, for example. FIG. 5 is a perspective view showing an extracted graphene wire portion formed in the groove provided in the insulating film 61 on the connection insulating film 22. A concave portion is formed on the surface side of the insulating film 61 and the graphene wire portion is formed in the concave portion. Specifically, after a catalyst underlying layer 31 and catalyst layer 32 are formed in the concave portion of the insulating film 61, a graphene layer 33 is formed to fill the concave portion. Thus, by intentionally forming a step portion caused by the concave portion and controlling the graphene growth origin, the wiring direction becomes the same as a graphene developing direction and graphene can easily grow.

After the graphene layer 33 is formed, a graphene protection layer 34 and upper-layer insulating film 35 are formed like the first embodiment.

Next, like the first embodiment, as shown in FIG. 4C, the connection insulating film 22 and the second substrate 30 formed thereon are separated from the underlying substrate 36 by melting the separation layer 37 by alkali treatment or the like. At this time, a temporary connection layer and support substrate may be formed on the upper-layer insulating film 35 before separation from the underlying substrate 36. Further, instead of using the separation layer 37, the underlying substrate 36 may be cut off and removed by use of a CMP and sand blast method or the like.

Next, as shown in FIG. 4D, the second substrate 30 including the graphene layer 33 is stuck above the first substrate 10 having the low-temperature coping semiconductor elements 14 formed therein with the connection insulating films 21, 22 disposed therebetween. At this time, alignment is made with the mark 71 used as a reference. The alignment process is not necessarily strict and it is sufficient if the graphene portion is roughly set in a wiring region.

Next, as shown in FIG. 4E, the lithography and RIE formation process for processing the wire portion formed in the grooves into a wire form are performed to form graphene wires. Even if unwanted portions of end portions are left behind at the graphene wire processing time, no problem occurs. For the purpose of easily performing the RIE process, a hard mask for processing may be formed.

Next, as shown in FIG. 4F, an interlayer insulating film 51 is formed to cover the graphene wires and then contact holes 41 for connection of the graphene wires to the lower-layer semiconductor elements 14 are formed. Then, for example, W used as a conductive material is filled in the contact holes 41 to form through vias 40. As a result, the graphene layers 33 and semiconductor elements 14 are electrically connected.

After this, an upper-layer protection insulating film 52 and upper-layer wire 53 are formed to realize the structure shown in FIG. 3. As the circuit structure, the upper-layer wire 53 may be formed on the through vias 40 when the graphene wires and the upper-layer wire 53 are connected. If it is not necessary to connect the graphene wires to the upper-layer wire 53, the structure in which the wires 53 are not formed on the through vias 40 and the upper portions of the through vias 40 are covered with the protection insulating film 52 may be provided.

Thus, according to the present embodiment, the same effect as that of the first embodiment described before can of course be obtained and the following effect can also be obtained by partially forming the graphene layers 33 of the second substrate 30 in alignment with the wire formation region of the underlying substrate. That is, the graphene layers 33 can be formed only in a required region in which step portions are formed to easily grow graphene and the quality of the graphene layers 33 can be enhanced. Further, since an extra amount of the graphene layers 33 can be reduced, the advantage that the wiring process of the graphene layers 33 can easily be performed is obtained.

Third Embodiment

FIG. 6 is a cross-sectional view showing the schematic structure of a semiconductor device according to a third embodiment. The same symbols are attached to the same portions as those of FIG. 1 and the detailed explanation thereof is omitted.

The present embodiment is different from the first embodiment described before in that the graphene structure is reversed and then stuck to a first substrate 10. That is, in the structure shown in FIG. 2B, a second substrate 30 is vertically reversed and stuck on the first substrate 10 before separating the same from an underlying substrate 36. At this time, an upper-layer insulating film 35 is stuck to a connection insulating film 21 instead of a connection insulating film 22.

After sticking the first and second substrates 10, 30, the underlying substrate 36 connected to the substrate 30 is removed. After this, a semiconductor device having graphene wires like the first embodiment can be obtained by performing a wiring process, a formation process of interlayer insulating film 51 and a process of forming through vias 40 like the first embodiment.

Thus, according to this embodiment, the same effect as that of the first embodiment can of course be obtained and the following effect can also be obtained by reversing the graphene structure. That is, even when the film stress of a catalyst layer 32 or graphene layer 33 is high, it becomes unnecessary to provide a support substrate at the graphene lead-out time and a manufacturing cost merit that the number of manufacturing steps can be reduced is obtained. Further, the process can be more easily performed from the viewpoint of smoothness of the surface.

MODIFICATION

This invention is not limited to the above embodiments.

The semiconductor elements provided on the first substrate side are not necessarily limited to the memory elements and it is sufficient if they are semiconductor elements formed by a low-temperature process of 400° C. or less.

In the embodiments, the through via is formed to penetrate the central portion of the graphene layer, but since the through via may be required only to make contact with the graphene layer, the through via may be formed to penetrate one of the side portions of the graphene layer. Further, it is not always necessary to set the diameter of the through via smaller than the width of the graphene wire and the diameter may be set equivalent to or larger than the width of the graphene wire.

Additionally, the condition of the temperature, source gas and the like for forming a graphene layer is not limited to the condition explained in the embodiments and can be adequately modified according to the specification. Further, the materials of the catalyst layer for growing graphene, connection insulating film and through vias are not limited to those explained in the embodiments and can be adequately modified according to the specification.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate including semiconductor elements formed thereon,
   a graphene wiring structure stuck on the substrate with a connection insulating film disposed therebetween, the graphene wiring structure including graphene wires, and
   through vias formed through the graphene wiring structure and connection insulating film, each via connecting part of the semiconductor element to the graphene wire.

2. The device of claim 1, wherein the graphene layer includes a catalyst layer formed of one of Co and Ni metals to grow graphene and a graphene layer formed on the catalyst layer.

3. The device of claim 2, wherein the catalyst layer is added with a refractory metal.

4. The device of claim 2, wherein the substrate has the semiconductor elements formed at temperatures of not higher than 400° C.

5. The device of claim 4, wherein the graphene layer is grown at temperatures of not lower than 450° C.

6. The device of claim 2, wherein the graphene wire is formed by depositing the graphene layer on the catalyst layer at temperatures of not lower than 600° C.

7. The device of claim 1, wherein the graphene wiring structure has a damascene groove in a region larger than a region in which the graphene wires are formed and the graphene layer is formed in the groove.

* * * * *